United States Patent
Li et al.

(10) Patent No.: US 11,699,602 B2
(45) Date of Patent: Jul. 11, 2023

(54) SUBSTRATE SUPPORT ASSEMBLIES AND COMPONENTS

(71) Applicant: Applied Materials, Inc., Santa Clara, CA (US)

(72) Inventors: Jian Li, Fremont, CA (US); Edward P. Hammond, Hillsborough, CA (US); Viren Kalsekar, Mountain View, CA (US); Vidyadharan Srinivasa Murthy Bangalore, Bengaluru (IN); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/922,404

(22) Filed: Jul. 7, 2020

(65) Prior Publication Data

US 2022/0013373 A1    Jan. 13, 2022

(51) Int. Cl.
*H01L 21/67* (2006.01)
*H01L 21/673* (2006.01)
*H01L 21/687* (2006.01)

(52) U.S. Cl.
CPC .. *H01L 21/67103* (2013.01); *H01L 21/67313* (2013.01); *H01L 21/68742* (2013.01)

(58) Field of Classification Search
CPC ......... H01L 21/67103; H01L 21/67313; H01L 21/68742; H01L 21/68771; H01L 21/68792; H01L 21/68764
See application file for complete search history.

(56) References Cited

U.S. PATENT DOCUMENTS 5,662,470 A * 9/1997 Huussen ........... H01L 21/67115
    432/5
6,066,836 A * 5/2000 Chen ..................... C23C 16/46
    219/390

(Continued)

FOREIGN PATENT DOCUMENTS

JP       2009-054871 A    3/2009
KR       100587681 B1     6/2006

(Continued)

OTHER PUBLICATIONS

International Search Report and Written Opinion dated Oct. 28, 2021 in International Patent Application No. PCT/US2021/040223, 10 pages.

(Continued)

*Primary Examiner* — Mohammed Shamsuzzaman
(74) *Attorney, Agent, or Firm* — Kilpatrick Townsend & Stockton LLP

(57) ABSTRACT

Exemplary substrate support assemblies may include a platen characterized by a first surface configured to support a semiconductor substrate. The assemblies may include a first stem section coupled with a second surface of the platen opposite the first surface of the platen. The assemblies may include a second stem section coupled with the first stem section. The second stem section may include a housing and a rod holder disposed within the housing. The second stem section may include a connector seated within the rod holder at a first end of the connector. The second stem section may include a heater rod disposed within the first end of the connector and a heater extension rod coupled with the connector at a second end of the connector. The second stem section may include an RF rod and an RF strap coupling the RF rod with an RF extension rod.

5 Claims, 10 Drawing Sheets

(56) References Cited

U.S. PATENT DOCUMENTS

| | | | | |
|---|---|---|---|---|
| 6,645,303 | B2* | 11/2003 | Frankel | G07F 17/3202 |
| | | | | 156/345.52 |
| 8,071,920 | B2* | 12/2011 | Shimanuki | H05B 3/143 |
| | | | | 219/541 |
| 9,088,085 | B2* | 7/2015 | Lind | H01R 35/04 |
| 9,245,744 | B2 | 1/2016 | Shanker et al. | |
| 10,177,024 | B2* | 1/2019 | Gomm | H01L 21/6831 |
| 10,704,142 | B2* | 7/2020 | Mustafa | G01K 7/16 |
| 2004/0246459 | A1* | 12/2004 | Tinnemans | H01L 21/6833 |
| | | | | 355/75 |
| 2005/0258142 | A1 | 11/2005 | Cho | |
| 2010/0163188 | A1 | 7/2010 | Tanaka et al. | |
| 2011/0147363 | A1* | 6/2011 | Yap | H01L 21/68792 |
| | | | | 219/385 |
| 2014/0087587 | A1* | 3/2014 | Lind | H01J 37/32532 |
| | | | | 439/527 |
| 2016/0333475 | A1* | 11/2016 | Gomm | H01L 21/68757 |
| 2016/0336213 | A1* | 11/2016 | Gomm | C23C 16/509 |
| 2021/0320027 | A1* | 10/2021 | Huang | H01L 21/67017 |
| 2022/0122870 | A1* | 4/2022 | Parimi | H01L 21/67023 |

FOREIGN PATENT DOCUMENTS

| | | | | |
|---|---|---|---|---|
| TW | 200616139 A | | 5/2006 | |
| WO | WO-9929146 A1 | * | 6/1999 | ....... C23C 16/45565 |
| WO | 2011-075437 A2 | | 6/2011 | |
| WO | WO-2022109522 A1 | * | 5/2022 | ....... C23C 16/45565 |
| WO | WO-2022225797 A1 | * | 10/2022 | ....... C23C 16/45565 |

OTHER PUBLICATIONS

Application No. PCT/US2021/040223, International Preliminary Report on Patentability, dated Jan. 19, 2023, 9 pages.

\* cited by examiner

SUBSTRATE SUPPORT ASSEMBLIES AND COMPONENTS

TECHNICAL FIELD

The present technology relates to semiconductor processes and equipment. More specifically, the present technology relates to semiconductor substrate supports.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Within a processing chamber may be a substrate support, which may maintain a substrate during processing, in addition to performing other operations, such as clamping the substrate in any number of ways, as well as heating the substrate. Substrate supports may also raise and lower a substrate during processing to position a substrate at a particular location within a processing region. When maintenance is to be performed on a substrate support, a top section of the processing chamber may be lifted, which may provide access to remove the substrate support for service. However, for chambers utilizing elongated substrate supports, removal of the substrate support from a chamber may be difficult.

Thus, there is a need for improved systems and components that can be used to efficiently access substrate supports within semiconductor processing chambers. These and other needs are addressed by the present technology.

SUMMARY

Exemplary substrate support assemblies may include a platen characterized by a first surface configured to support a semiconductor substrate. The assemblies may include a first stem section coupled with a second surface of the platen opposite the first surface of the platen. The assemblies may include a second stem section coupled with the first stem section. The second stem section may include a housing. The second stem section may include a rod holder disposed within the housing. The second stem section may include a connector seated within the rod holder at a first end of the connector. The second stem section may include a heater rod disposed within the first end of the connector. The second stem section may include a heater extension rod coupled with the connector at a second end of the connector. The second stem section may include an RF rod. The second stem section may include an RF extension rod extending through the rod holder. The second stem section may include an RF strap coupling an end of the RF extension rod with an end of the RF rod.

In some embodiments, the connector may be removably seated within the rod holder. The second end of the connector may extend through the rod holder, and a gap may be maintained between the rod holder and the heater extension rod. The housing may define an aperture proximate a location where the second stem section couples with the first stem section. A guide extending from the first stem section may be accessible through the aperture defined in the housing. The RF extension rod may be fixedly coupled in the rod holder, and the RF strap may include a flexible coupling configured to accommodate thermal expansion of the RF rod.

Some embodiments of the present technology may encompass substrate support assemblies. The assemblies may include a platen characterized by a first surface configured to support a semiconductor substrate. The assemblies may include a first stem section coupled with a second surface of the platen opposite the first surface of the platen. The assemblies may include a second stem section fixedly coupled with the first stem section. The second stem section may include a housing, an RF rod extending from the first stem section, a first RF extension rod, and an RF strap coupling an end of the first RF extension rod with an end of the RF rod. The assemblies may include a third stem section. A subassembly comprising the platen, the first stem section, and the second stem section may be removably coupled with the third stem section. The third stem section may include a housing, a rod holder disposed within the housing of the third stem section, a first connector seated within the rod holder at a first end of the first connector, a heater rod disposed within the first end of the first connector, a heater extension rod coupled with the first connector at a second end of the first connector, a second connector coupled with the first RF extension rod at a first end of the second connector, and a second RF extension rod coupled with the second connector at a second end of the second connector.

In some embodiments, the assemblies may include a cooling hub. The third stem section may be disposed within and coupled with the cooling hub. The second stem section may define a rim, and the second stem section may be seated on the cooling hub about the rim of the second stem section. The rod holder may be a first rod holder, and the substrate support assembly may also include a second rod holder disposed in the second stem section. The first RF extension rod may be fixedly coupled in the second rod holder, and the RF strap may include a flexible coupling configured to accommodate thermal expansion of the RF rod. The first connector may be removably seated within the rod holder. The second end of the first connector may extend through the rod holder, and a gap may be maintained between the rod holder and the heater extension rod. The platen and the first stem section may be or include a ceramic.

The substrate support assembly may be characterized by a length greater than or about 0.5 m. The assemblies may include a first thermocouple connector seated in the rod holder. The first thermocouple connector may include a conductive housing including a thermocouple socket, and the conductive housing may be coupled with electrical ground. The first thermocouple connector may be maintained at least 5 mm away from the first RF extension rod. The assemblies may include a thermocouple extending to the platen through the first stem section and the second stem section. The thermocouple may include a second thermocouple connector coupled with the first thermocouple connector. The second thermocouple connector may include a conductive housing and a connector pin. The second thermocouple connector may include a spring coupling within the conductive housing of the second thermocouple connector configured to couple about the conductive housing of the first thermocouple connector.

Some embodiments of the present technology may encompass substrate support assemblies. The assemblies may include a platen characterized by a first surface configured to support a semiconductor substrate. The assemblies may include a first stem section coupled with a second surface of the platen opposite the first surface of the platen. The assemblies may include a second stem section fixedly coupled with the first stem section. The second stem section may include a housing, an RF rod extending from the first stem section, a first RF extension rod, and an RF strap coupling an end of the first RF extension rod with an end of the RF rod. The assemblies may include a third stem section including a housing, a rod holder disposed within the housing of the third stem section, a first thermocouple connector seated in the rod holder, and a thermocouple extending to the platen through the first stem section and the second stem section. The thermocouple may include a second thermocouple connector coupled with the first thermocouple connector.

In some embodiments the first thermocouple connector may include a conductive housing including a thermocouple socket. The thermocouple housing may be coupled with electrical ground. The second thermocouple connector may include a conductive housing, and a spring coupling within the conductive housing of the second thermocouple connector. The spring coupling may be configured to couple about the conductive housing of the first thermocouple connector.

Such technology may provide numerous benefits over conventional systems and techniques. For example, the substrate support assemblies may be more readily removed from chambers than conventional designs. Additionally, the component couplings may facilitate operation over extended lengths through the substrate support. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
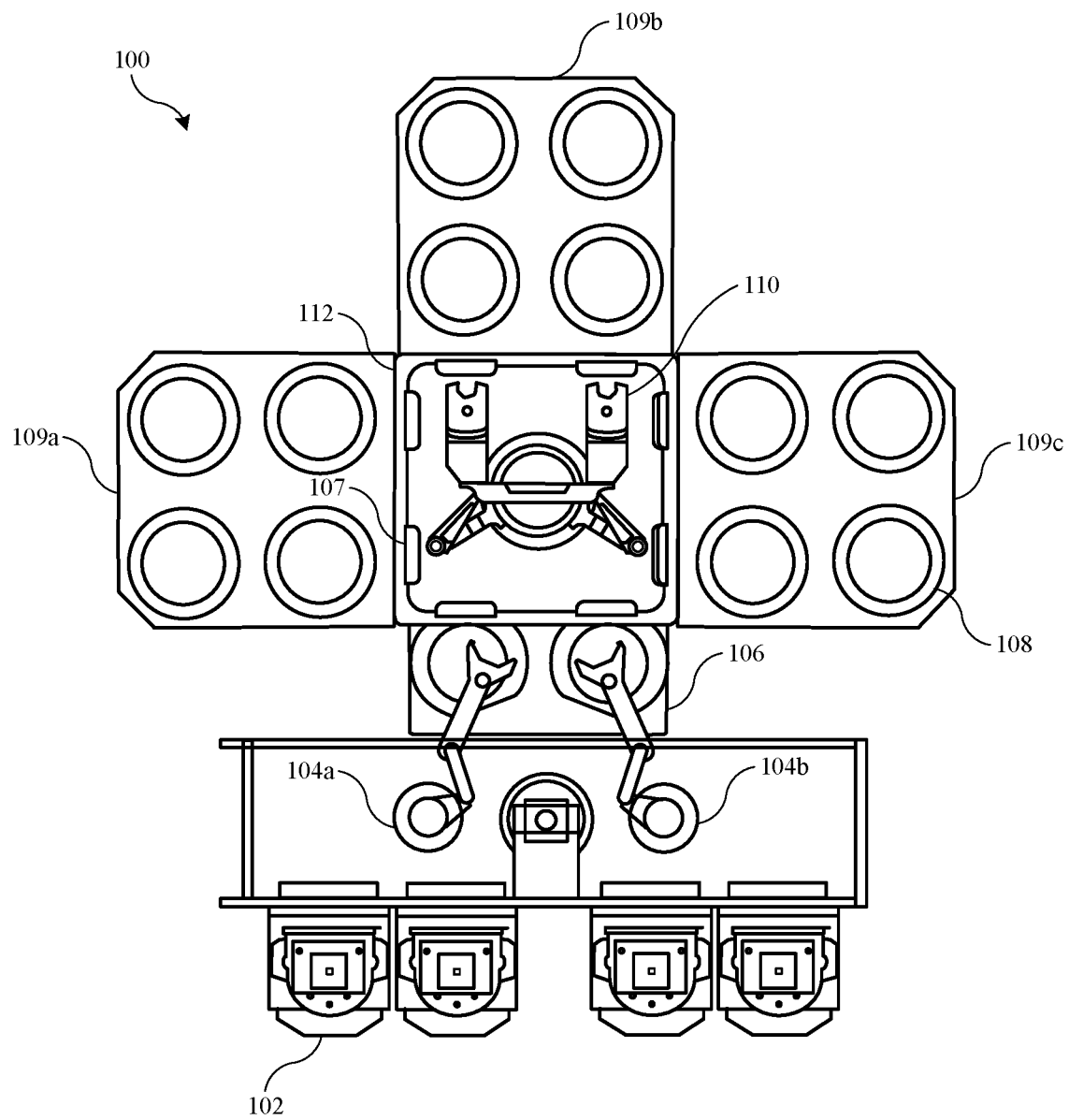
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. As the vertical distance of a processing chamber is increased, a substrate support may be elongated to accommodate the distance to bring a substrate to an overlying processing position and an underlying transfer position, for example.

To service a substrate support assembly, a top lid, which may support the lid stack, may be removed, which may provide access to the substrate support within the chamber. The substrate support assembly may then be withdrawn from the chamber for maintenance. For elongated substrate supports, such as greater than or about a half meter in length, removing the substrate support may be a challenge, depending on how far the lid may be pulled from the chamber. The substrate support may then be extracted at an angle, which may damage internal components, if the substrate support may be removed at all. The present technology overcomes these issues by providing substrate support assemblies with increased integrity and/or the ability for some sections to be separated from other sections, reducing the overall length of the substrate support shaft. The present technology may also provide improved component couplings allowing internal substrate support components to be separated along with the shaft sections.

Although the remaining disclosure will routinely identify specific structures, such as four-position transfer regions, for which the present structures and methods may be employed, it will be readily understood that the substrate support assemblies or components may be equally employed in any number of other systems or chambers. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
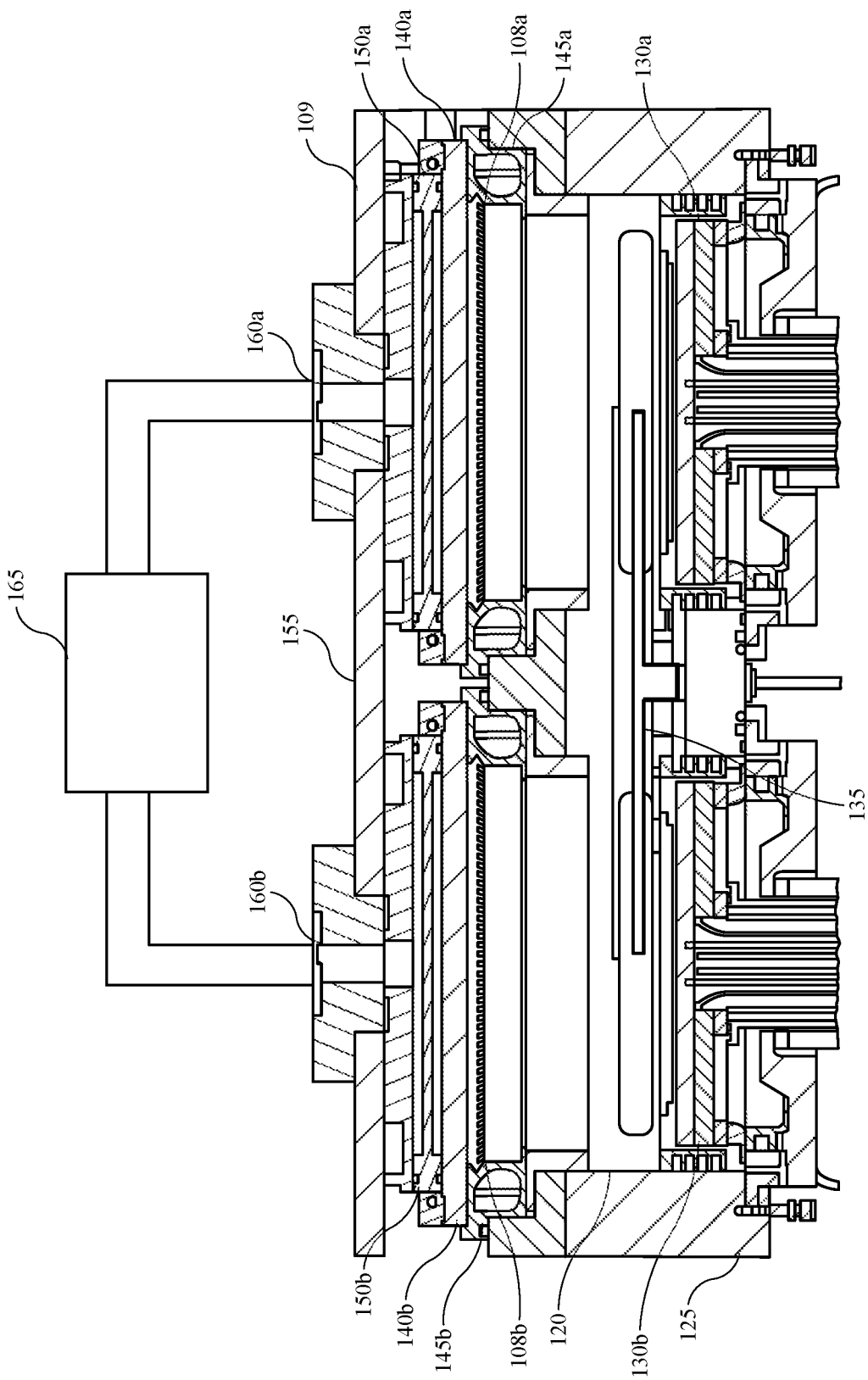
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

Figure 2:
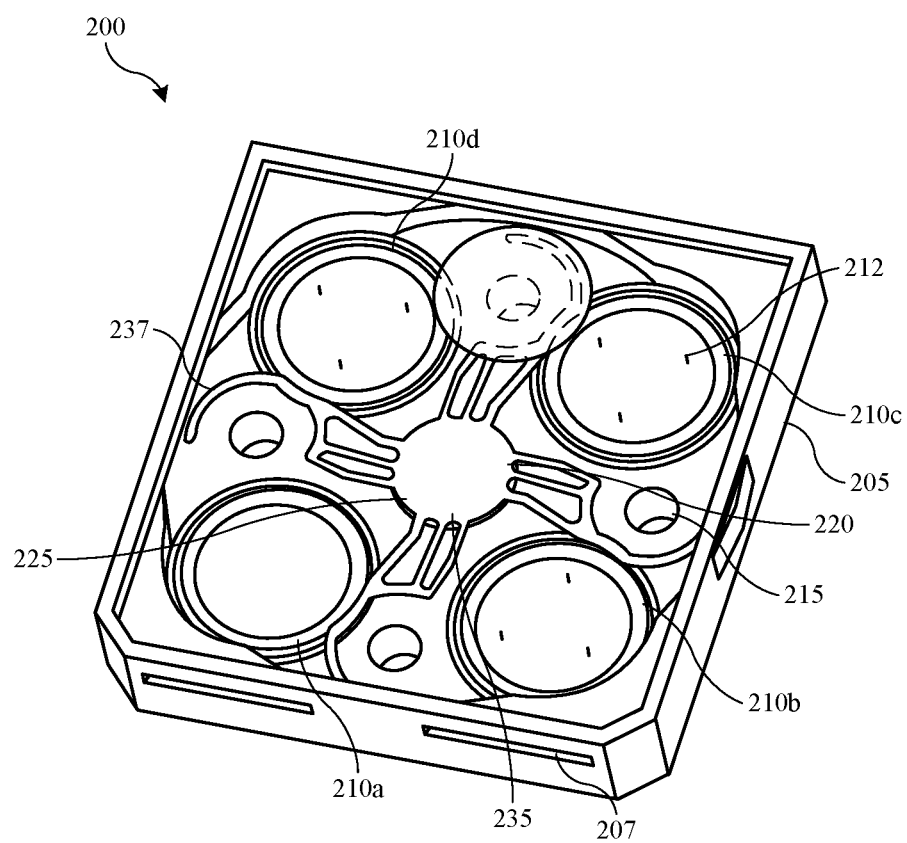
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
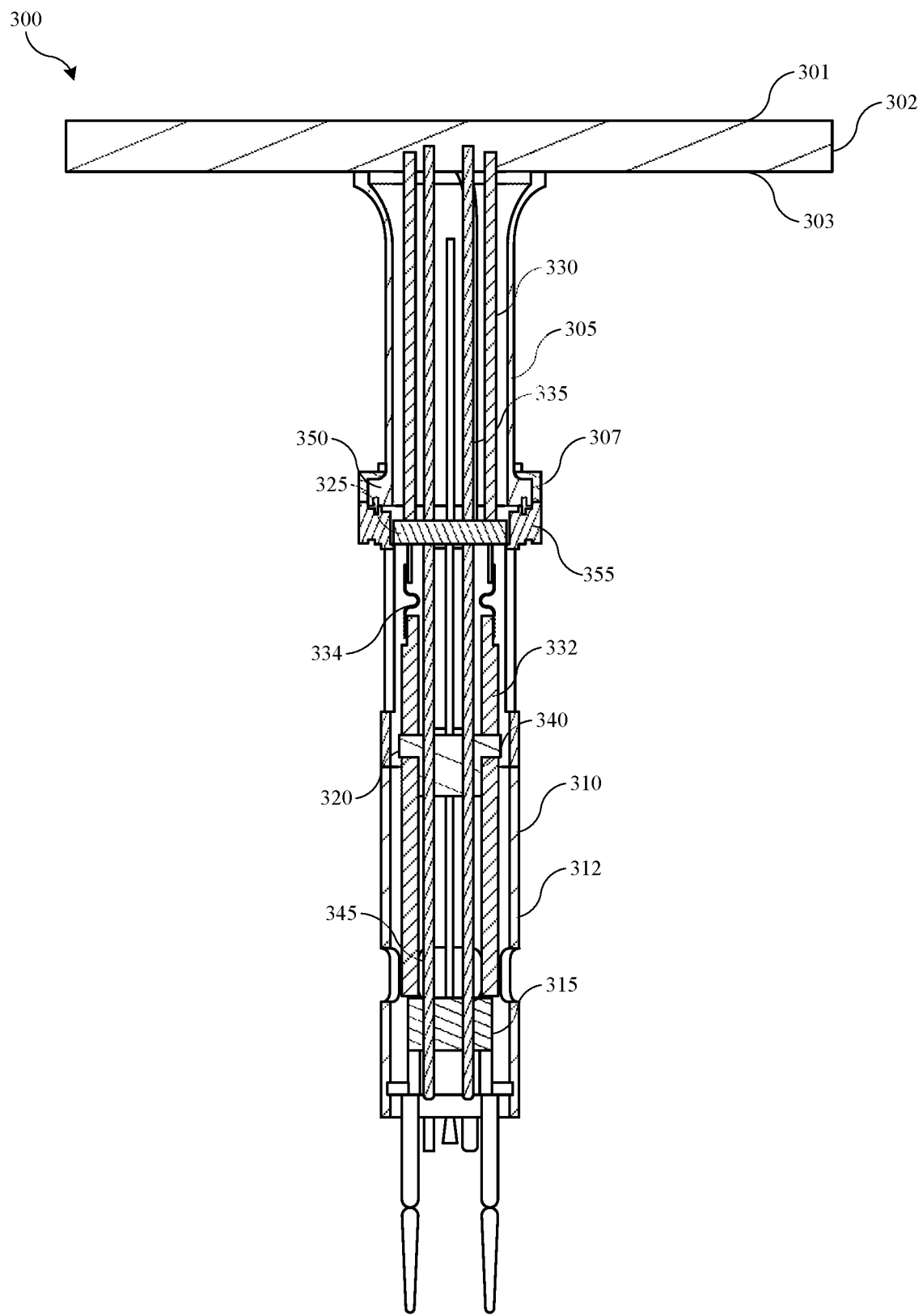
FIG. 3 shows a schematic cross-sectional view of an exemplary substrate support according to some embodiments of the present technology.

To compensate for the travel distance between the transfer chamber and processing regions overlying the transfer chamber, the present technology may utilize substrate supports configured to extend between the two regions. FIG. 3 shows a schematic cross-sectional view of an exemplary substrate support 300 according to some embodiments of the present technology. Substrate support 300 may be an assembly, and may illustrate additional detail of substrate supports described above, including substrate supports 210, and may include any of the aspects, components, or characteristics of substrate supports 130 or substrate supports 210 described above. For example, substrate support 300 may be an extended substrate support configured to translate a substrate between transfer region 120 and processing region 108. In some embodiments substrate support 300 may be characterized by a length greater than or about 400 mm, such as greater than or about 500 mm, greater than or about 600 mm, or more.

Substrate support 300 may be configured to support a semiconductor substrate on a first surface 301 of a platen 302. Platen 302 may be or include any number of materials, such as dielectric materials, including ceramics, as well as conductive materials, such as metals or other materials. Platen 302 may be coupled with a stem along a second surface 303 of the platen, which may be a surface opposite the first surface of the platen. The stem may include a first stem section 305, and a second stem section 310. The first stem section may extend within the processing chamber, and may be the same material as the platen 302. For example, in some embodiments the first stem section may be ceramic. The second stem section may be positioned within a cooling hub as will be described further below, which may be disposed within or beneath the transfer chamber housing, for example. The second stem section 310 may include a housing 312, such as a rigid housing, and which may be a metal material in some embodiments. The first stem section 305 may include a sealing band 307 extending about an end of the first stem section 305, and which may clamp the first stem section 305, which may be ceramic, to the housing of the second stem section 310.

Within the second stem section 310 may be a number of components extending towards and/or into the first stem section 305, for interaction with the platen. For example, in some embodiments substrate support 300 may be an electrostatic chuck, and may include one or more electrodes for clamping the substrate to the platen. In some embodiments, the substrate support 300 may be a bipolar electrostatic chuck, and may include two electrodes configured to clamp the substrate to the platen. Similarly, a resistive heater may be embedded within the platen 302, and may be configured to heat the platen and substrate. The electrodes and heater, which may be meshes or other components, may be disposed within the platen 302, and may be accessed through one or more rods extending up through the shaft from one or more power supplies disposed below or external to the processing chamber. Although in some embodiments the rods may extend the full distance of the shaft, because of the length of the shaft sections, in some embodiments the components may be separated into one or more sections, which may accommodate the length and operational aspects of the components. For example, as noted above, the substrate support may be configured to operate at temperatures well over 100° C., which may cause thermal expansion of components in contact with the platen. However, at a distal end of the shaft away from the platen, the temperature may be closer to room temperature, and thus breaks or modifications may be included with some components to limit temperature effects.

For example, in some embodiments, none of the heater or electrode couplings may extend directly between a power source separate from the substrate support and the platen. In some embodiments at least one break or separation may be included between the power source coupling and the platen. The components extending through the shaft may be maintained in one or more components configured to hold or guide the components through the shaft. For example, in some embodiments, the shaft may include one or more holders or guides as illustrated. A first rod holder 315 may be positioned at a distal end of the second stem section, the proximal end coupled with the first stem section, for example. A second rod holder 320 may be positioned between the proximal end and the distal end of the second stem section. A third rod holder 325 may be positioned at the proximal end of the second stem section, and may be an insulator with guide apertures configured to provide the various components from the first stem section 305 to the second stem section 310.

Extending from the first stem section 305 may be a first set of couplings for the electrodes and the heater. In some embodiments, one or more electrodes may be included, and one or more heater connections or zones may be included within the platen, and hence one or more electrode rods, or RF rods, as well as one or more heater rods may extend from the first shaft, and which may each couple with an associated component embedded within the platen. In some embodiments at least one RF rod and at least one heater rod may extend from the platen through the first stem section and into the second stem section. In some embodiments greater than or about two, greater than or about three, greater than or about four, greater than or about five, or more of each rod may extend from the platen through the first stem section and into the second stem section. Some or all of these rods may extend through the third rod holder 325 or insulator guide, which may provide the components for coupling within the shaft.

For example, one or more RF rods 330 may extend from the first stem section 305, and one or more heater rods 335 may extend from the first stem section 305. In some embodiments any of the rods may extend to any length, and include breaks at any location through the stem sections. The rods may be or include any number of materials to conductively couple one or more power sources to the electrodes or heaters within the platen. For example, any of the rods may be or include copper, nickel, tungsten, zinc, silver, gold, beryllium, tungsten, cobalt, or any other conductive material or combination of conductive materials, including alloys or a first metal plated over a second metal. In some embodiments the RF rods 330 may be or include the same or a different material from the heater rods 335. Additionally, in some embodiments a first rod section may be or include a first material or set of materials, and a second rod section may be or include a second material or set of materials. Because of the different transmission effects extending across the materials, in some embodiments different materials may be used for the components.

For example, in some embodiments the heater rods extending from the first pedestal section may be or include nickel, while the RF rods and the heater extension rods may be or include copper and zinc, such as a copper-zinc alloy, which may include a silver plating along an exterior surface of the rod. The heater may conduct current through the nickel rod, while the RF rod may conduct current more superficially. For example, RF current may include higher currents than the heater rods, and the current may be transmitted at higher frequencies. Additionally, RF current may transmit along only the surface of the rod, and the skin depth may be on the order of a few dozen microns or less, which may further increase the temperature of the rod. Consequently, thermal expansion of the RF rod may be greater than thermal expansion of the heater rods in some embodiments during operation. Although the rod components may extend through the substrate support stem similarly, in some embodiments the RF rod may include one or more breaks at different locations from the heater rods.

For example, the RF rods may be characterized by a greater outside diameter in some embodiments compared to the heater rods, and thus the coupling of the RF rods to one or more extension rods may be performed differently in some embodiments. An RF rod 330 may extend through the first stem section and couple with the electrode or electrodes within the platen. The RF rod may extend through the third rod holder 325, and may be coupled with an RF extension rod 332. The RF extension rod 332 may be seated through each of the first rod holder 315 and the second rod holder 320 in some embodiments. The rod holders may all be an insulative or dielectric material, which may mechanically support the components. Any number of materials may be used, including polytetrafluoroethylene, polyether ether ketone, or any other polyaryletherketone, as well as a number of other polymeric or ceramic materials. One or more components may be fixedly coupled within one or more of the supports, for example, and RF extension rod 332 may be fixedly coupled within second rod holder 320 to maintain a location of the RF extension rod from other components, as will be described further below.

When RF extension rod 332 is fixedly coupled in position, the rod may be restricted from thermally expanding during processing operations. Consequently, RF rod 330 may be spatially separated from RF extension rod 332 as illustrated. In some embodiments, an RF strap 334 may electrically couple the RF extension rod 332 with the RF rod 330. As noted above, RF rod 330 may be characterized by high temperature thermal expansion, which may cause RF rod 330 to expand laterally. Because RF extension rod 332 may be substantially fixed in position in second rod holder 320, the extension rod may not be able to accommodate the thermal expansion of the RF rod. RF strap 334 may be configured to accommodate vertical expansion of the RF rod, while maintaining electrical coupling between the RF rod and RF extension rod. The RF strap 334 may include an amount of curvature about a midpoint of the strap to accommodate the vertical movement of the RF rod, and may include a bend as illustrated to allow an amount of vertical accommodation between the rods.

Heater rods 335 may extend through the third rod holder 325, and may extend into a coupling seated within the second rod holder 320 as illustrated. A connector 340 may be at least partially seated within second rod holder 320 as illustrated, and as will be explained in more detail below. The connector may be seated in the rod holder at the first end of the connector, while a second end of the connector may extend through the rod holder 320. Heater rod 335 may be disposed in the first end of connector 340. Additionally, a heater extension rod 345 may be coupled with the connector 340 at a second end of the connector. The heater extension rod 345 may extend through the second stem section 310 to couple with a power supply, for example. Because the heater rod may not include as much thermal expansion, the coupling may be performed using any number of connectors. For example, any number of clamps or electrical connectors may be used, including Multilam connectors or other connectors providing an amount of compressive or spring force against the heater rod. The RF strap 334 and the connector 340 may be or include any of the conductive materials or metals noted above, and may include combinations of materials, such as a nickel beryllium having a gold plating, for example.

Figure 4:
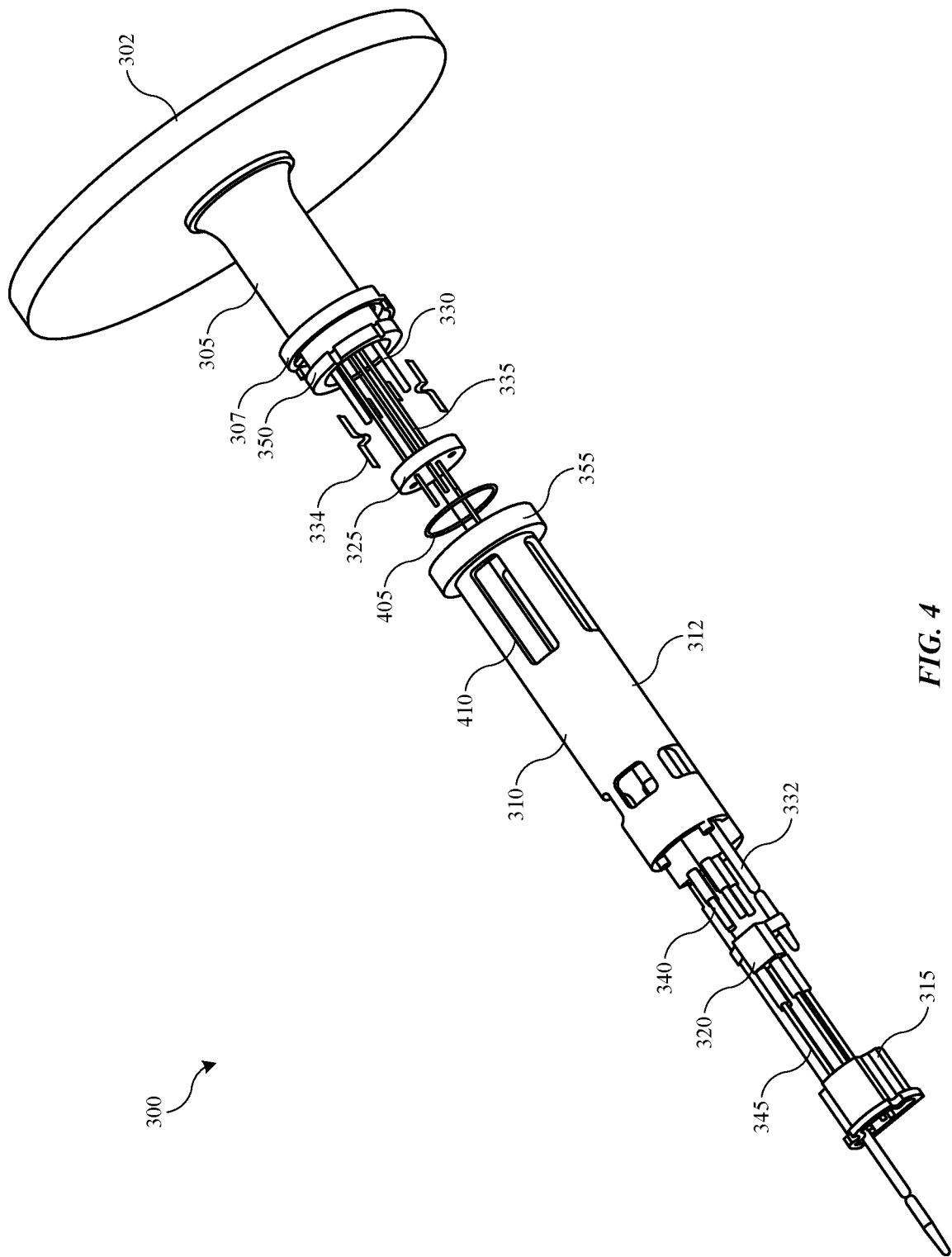
FIG. 4 shows a schematic exploded view of an exemplary substrate support according to some embodiments of the present technology.

Turning to FIG. 4 is shown a schematic exploded view of an exemplary substrate support 300 according to some embodiments of the present technology, which may illustrate additional features of substrate support 300 as described above. For example, substrate support 300 may include a platen 302 and a stem. The stem may include a first stem section 305 and a second stem section 310. As illustrated, first stem section 305 may seat on a ledge of second stem portion housing 312, and an elastomeric member or o-ring 405 may allow the components to be coupled without damaging the first stem section 305, which may be ceramic in some embodiments. A sealing band 307 may fit about a flange portion 350 of the first stem section and couple with a collar 355 of the housing 312, such as with bolts, screws, or any other sealing device. As will be described below, second stem section housing 312 may define one or more apertures 410, which may provide access for connecting components.

As discussed previously, substrate support 300 may include a number of RF rods and heater rods in some embodiments, which extend from the platen through the first stem section 305. RF rod 330 may not extend as far as heater rod 335 as illustrated. Although both rods may extend through third rod holder 325, heater rods 335 may couple at second rod holder 320 at connectors 340. As illustrated, connectors 340 may extend through second rod holder 320, where they may couple with heater extension rods 345, extending through first rod holder 315. RF rod 330 may couple with RF extension rods 332 between third rod holder 325 and second rod holder 320 with RF strap 334. As illustrated, RF strap 334 may be shaped to accommodate the vertical distance change from thermal expansion of RF rod 330.

Figure 5:
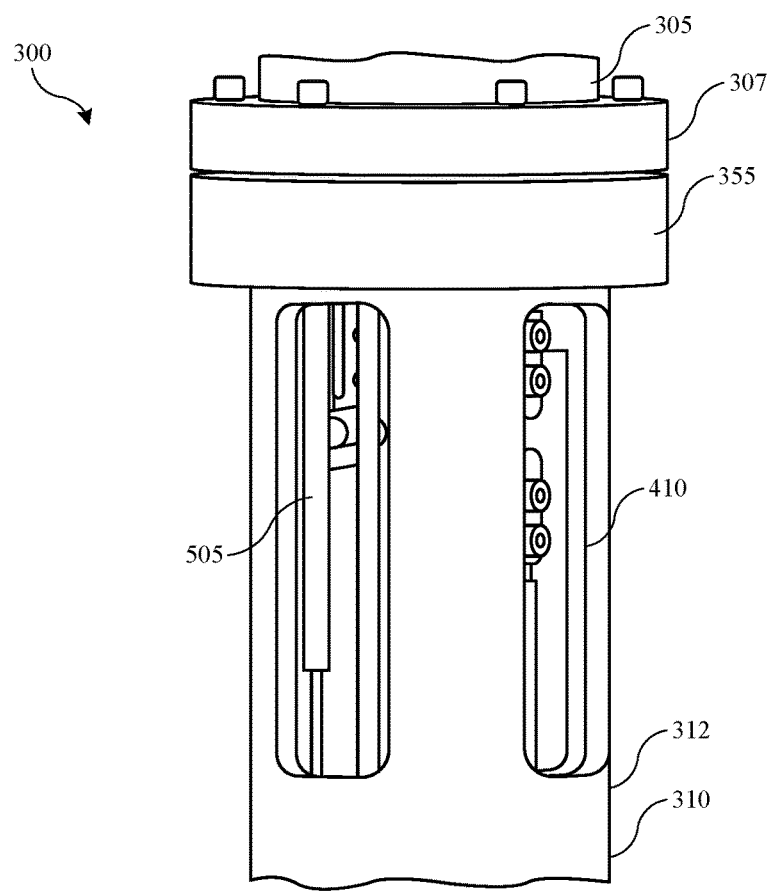
FIG. 5 shows a schematic view of a portion of an exemplary substrate support according to some embodiments of the present technology.

FIG. 5 shows a schematic view of a portion of an exemplary substrate support 300 according to some embodiments of the present technology. The figure may illustrate a detailed view of features of the substrate support 300 allowing coupling of components within the assembly. For example, housing 312 of second stem section 310 may define apertures 410, which may be proximate where second stem section housing 312 couples with sealing band 307, which extends about first stem section 305. Along with RF rods and heater rods, a guide member 505 may extend from first stem section 305 into second stem section 310. The second stem section may define apertures 410, which may allow coupling of the RF strap to the RF extension rod during assembly, and may allow access to guide 505, through which a thermocouple may be delivered. Thermocouples may include rigid and flexible thermocouples, which may be included to monitor temperature at the platen during operation. A rigid thermocouple may extend through the rod holders as previously described. Guide 505 may define a channel or lumen extending through first stem section 305 to the platen. A flexible thermocouple may be fed through guide 505 through apertures 410 and positioned at the platen for use.

Figure 6:
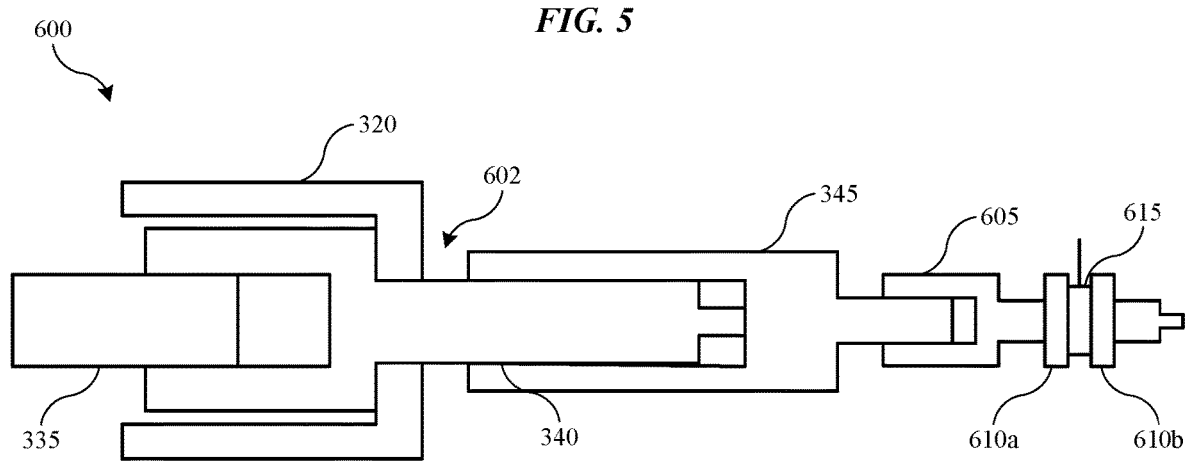
FIG. 6 shows a schematic cross-sectional view of a connector setup of an exemplary connector structure according to some embodiments of the present technology.

FIG. 6 shows a schematic cross-sectional view of a connector setup of an exemplary connector structure 600 according to some embodiments of the present technology. For example, connector structure 600 may include components incorporated with connector 340 described previously. As described above, connector 340 may be seated within second rod holder 320, and may be removably seated within second rod holder 320. Connector 340 may be a Multilam connector, or any other connector as previously described, and may couple with heater rod 335, which may be inserted within a first end of connector 340. A second end of connector 340 may extend through the second rod holder 320, and may be coupled with a heater extension rod 345 as previously described. For example, the second end of connector 340 may be threaded, allowing the components to be coupled, or any other coupling means may be used to electrically couple the components. As illustrated, in some embodiments the second end of connector 340 may be fully seated within the heater extension rod.

As illustrated previously, the heater extension rod may extend through a third rod holder, and an additional connector 605 may be coupled with the end of the heater extension rod. Connector 605 may be similar to connector 340, for example. An electrical coupling 615 may connect the heater rods with a power source, such as a ring connector or ring terminal coupled with an AC power source, which may provide power for the heater rods. In some embodiments all the heater rods may be coupled with the same power source, or each separate rod structure may be connected with a separate power source. A first lock nut 610*a* and a second lock nut 610*b* may be used to retain the electrical coupling in place during operation.

The heater rod 335 may also thermally expand during operation, and in some embodiments the heater rod may not be fully recessed within the connector 340. For example, in some embodiments the heater rod may be extended only 50% to about 75% of the distance within the connector, which may allow the heater rod to extend further within the connector 340 during thermal expansion. In some embodiments the heater rod may be positioned at least 50% within the connector 340 to ensure complete coupling, and retention of the heater rod. Subsequent operation, when heater rod 335 may cool, the heater rod may remain in the further extended position within the connector, such as about 60% to about 95% of the distance within the connector. In some embodiments, the heater rod 335 may not fully recess within the connector 340, which may ensure adequate room for expansion and prevent damage to the components, as the connector may be fully recessed in second rod holder 320.

During cooling of the heater rod 335, the rod may not be withdrawn from the connector 340 any distance. Instead, the remainder of the connector structure 600 may be drawn towards the heater rod 335. Accordingly, in some embodiments, a gap 602 may be maintained between the heater extension rod 345, which may be coupled about the second end of connector 340, and the second rod holder 320. A similar gap may be maintained between connector 605 and a third rod holder. This may ensure adequate distance to accommodate the movement back during thermal contraction of the heater rod 335. In subsequent operations during thermal expansion and contraction of the heater rod 335, the complete connector structure 600 may extend vertically back and forth within the gaps maintained between the components.

Figure 7:
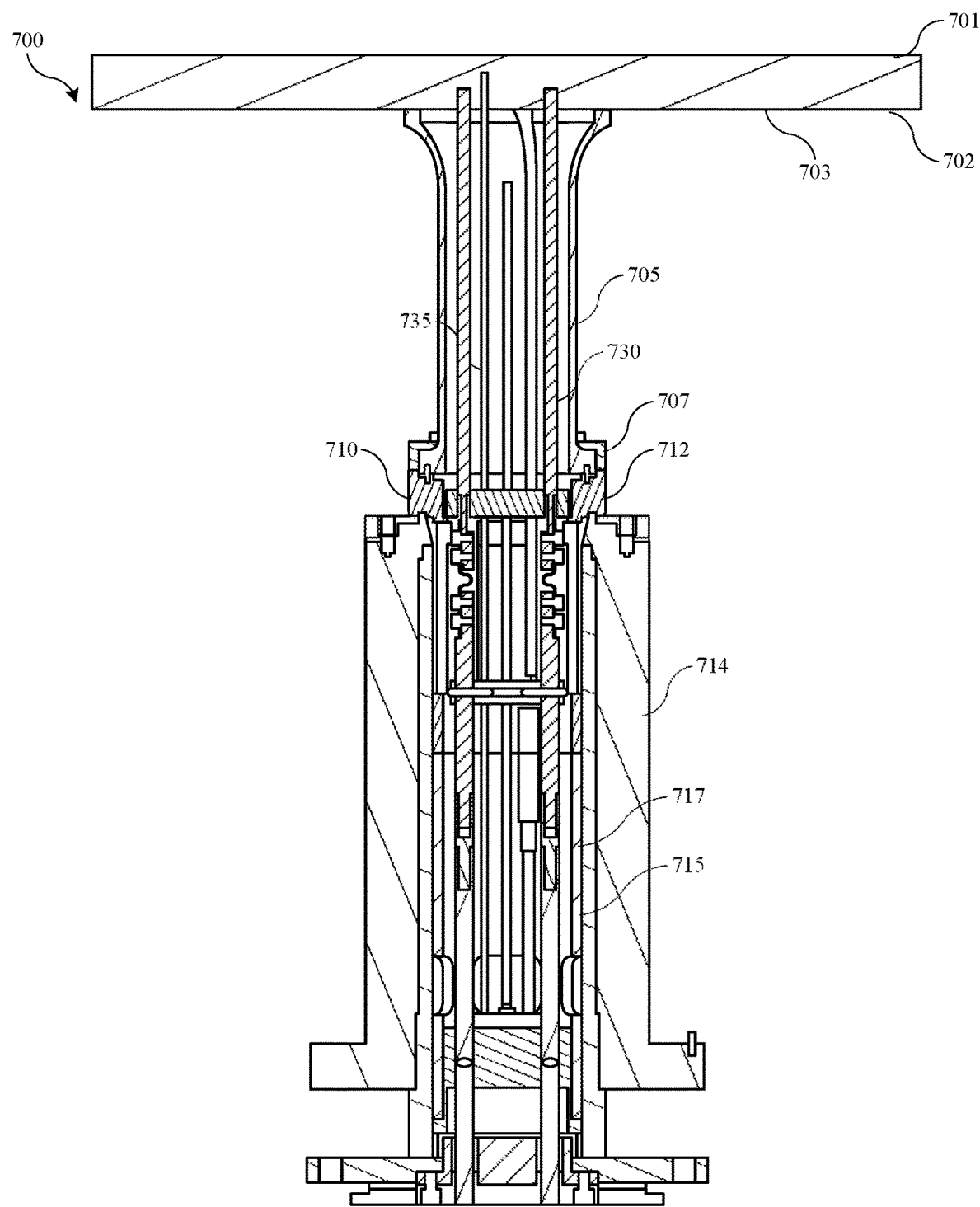
FIG. 7 shows a schematic cross-sectional view of an exemplary substrate support according to some embodiments of the present technology.

Turning to FIG. 7 is shown a schematic cross-sectional view of an exemplary substrate support 700 according to some embodiments of the present technology. Substrate support 700 may be an assembly, and may illustrate additional detail of substrate supports described above, and may include any of the aspects, components, or characteristics of substrate supports 130, 210, or 300 described above. Substrate support 700 may include any of the components, materials, or characteristics as described above, including for any components incorporated within the substrate support. For example, substrate support 700 may be an extended substrate support configured to translate a substrate between transfer region 120 and processing region 108. In some embodiments substrate support 700 may be characterized by a length greater than or about 400 mm, such as greater than or about 500 mm, greater than or about 600 mm, or more.

Substrate support 700 may be configured to support a semiconductor substrate on a first surface 701 of a platen 702. Platen 702 may be or include any number of materials, such as dielectric materials, including ceramics, as well as conductive materials, such as metals or other materials. Platen 702 may be coupled with a stem along a second surface 703 of the platen, which may be a surface opposite the first surface of the platen. The stem may include a first stem section 705, a second stem section 710, and a third stem section 715. The first stem section may extend within the processing chamber, and may be the same material as the platen 702. For example, in some embodiments the first stem section may be ceramic. Substrate support 700 may include additional components relative to substrate support 300, which may facilitate removal of aspects of substrate support 700 in some embodiments. For example, substrate support 700 may include multiple additional stem sections, which may be separable for removal of a portion of the substrate support.

Substrate support 700 may include a second stem section 710, which may be positioned within a cooling hub 714, and which may be disposed within or beneath the transfer chamber housing, for example. The second stem section 710 may include a housing 712, such as a rigid housing, and which may be a metal material in some embodiments. The first stem section 705 may include a sealing band 707 similarly as described above, and which may extend about an end of the first stem section 705. Sealing band 707 may clamp the first stem section 705, which may be ceramic, to the housing of the second stem section 710. Housing 712 may include a rim or flange section with which the first stem section 705 may be coupled. The flange section may also be seated on a ledge of the cooling hub 714. In some embodiments second stem section 710 may be seated on, and partially disposed within, the cooling hub 714 about the rim of second stem section 710, as illustrated, although the second stem section may not be fixed with the cooling hub.

A third stem section 715 may also be positioned within a cooling hub 714, and may include a housing 717. Housing 717 of the third stem section 715 may be fixedly coupled with the cooling hub 714, and may provide a landing for second stem section 710, which may be seated on alignment pins of the third stem section 715. In some embodiments, platen 702, first stem section 705, and second stem section 710 may form a subassembly of substrate support 700, which may be removably coupled with the third stem section 715. During servicing, platen 702, first stem section 705, and second stem section 710 may be decoupled from third stem section 715, and removed from the processing chamber. Second stem section 710 may be withdrawn from cooling hub 714, and components coupled between the sections may be disconnected. For example, substrate support 700 may include any number of RF rods 730 and heater rods 735 as described above with regard to substrate support 300.

Figure 8:
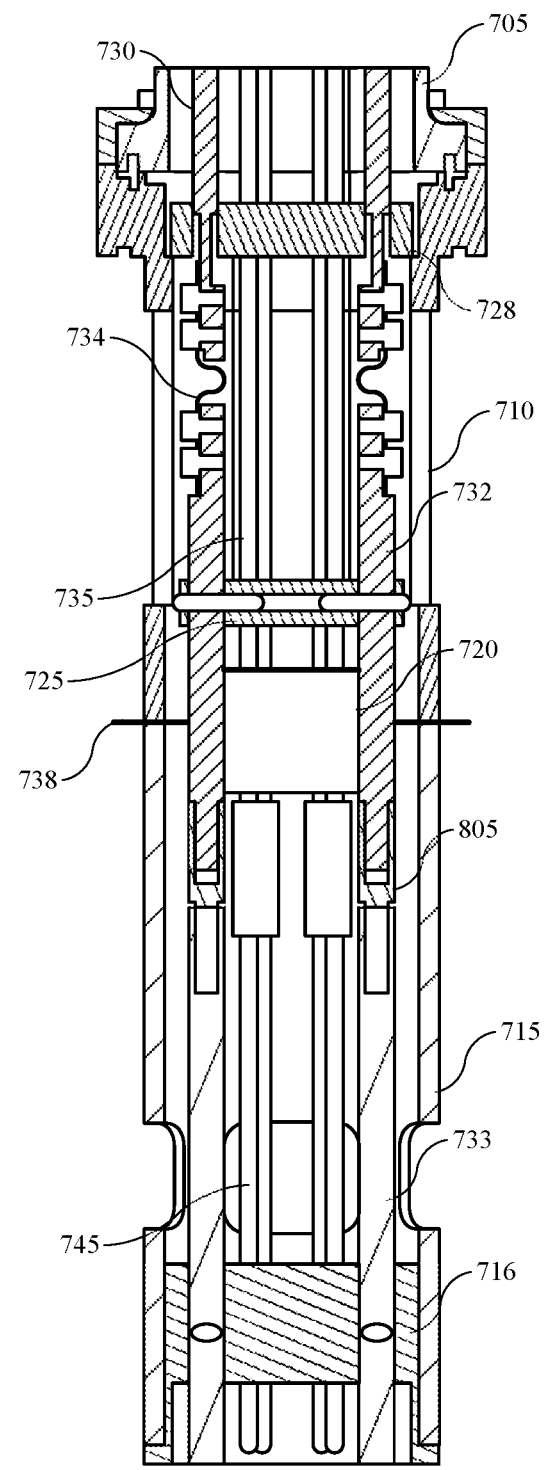
FIG. 8 shows a schematic cross-sectional partial view of an exemplary substrate support according to some embodiments of the present technology.

FIG. 8 shows a schematic cross-sectional partial view of an exemplary substrate support according to some embodiments of the present technology, and may show a first cross-sectional view of substrate support 700. For example, the section may illustrate aspects of the RF couplings through the stem sections. One or more RF rods 730, and one or more heater rods 735, may extend from first stem section 705 into second stem section 710. Similarly to as described above for substrate support assembly 300, RF rod 730 may couple with a first RF extension rod 732, with an RF strap 734. The RF strap may couple an end of the first RF extension rod 732 with an end of the RF rod as described previously, and the RF strap may be configured as a flexible coupling or shaped to accommodate vertical movement of the RF rod due to thermal expansion as described above.

A number of rod holders may be included within the housing sections to accommodate the multiple components within the sections of the housing. For example, a first rod holder 716 may be positioned within the third stem section 715, a second rod holder 720 may be positioned at the interface of the second stem section and the third stem section, and third rod holder 725 may be positioned within the second stem section, and may be fixed within the second stem section, and a fourth rod holder 728, or spacer, may be positioned proximate the rim of second stem section 710. Second rod holder 720 may be coupled with third stem section 715, and may define a break 738 with third stem section 715 where the substrate support 700 may be separated. Heater rod 735 may extend through second stem section 710 to couple with a heater extension rod 745 via a connector seated within second rod holder 720, similarly as described above.

Because second stem section 710 may be removed from third stem section 715, RF extension rod 732 may not extend fully through the third stem section, and instead may be coupled with a second RF extension rod 733 within third stem section 715. For example, a second connector 805 may be used to couple RF extension rod 732 with second RF extension rod 733. Connector 805 may be similar to the heater rod connectors as described previously, and may also be a Multilam or other connector electrically coupling the two RF extension rods. For example, connector 805 may be coupled with the RF extension rod 732 at a first end of the second connector, and second RF extension rod 733 may be coupled with the second connector at a second end of the second connector. Accordingly, when the subassembly is removed from the third stem section 715, RF extension rod 732 may be removed with the subassembly, and may decouple with second connector 805, which may remain within third stem section 715 and connected to second RF extension rod 733. To accommodate the RF extension rod 732, which may be connected with RF rod 730 via RF strap 734, which may be flexible, RF extension rod 732 may be fixedly coupled within third rod holder 725 in some embodiments. Accordingly, when the subassembly is removed from the cooling hub, undue tension may not be exerted on the RF strap when the RF extension rod 732 is withdrawn from the second connector 805.

Figure 9:
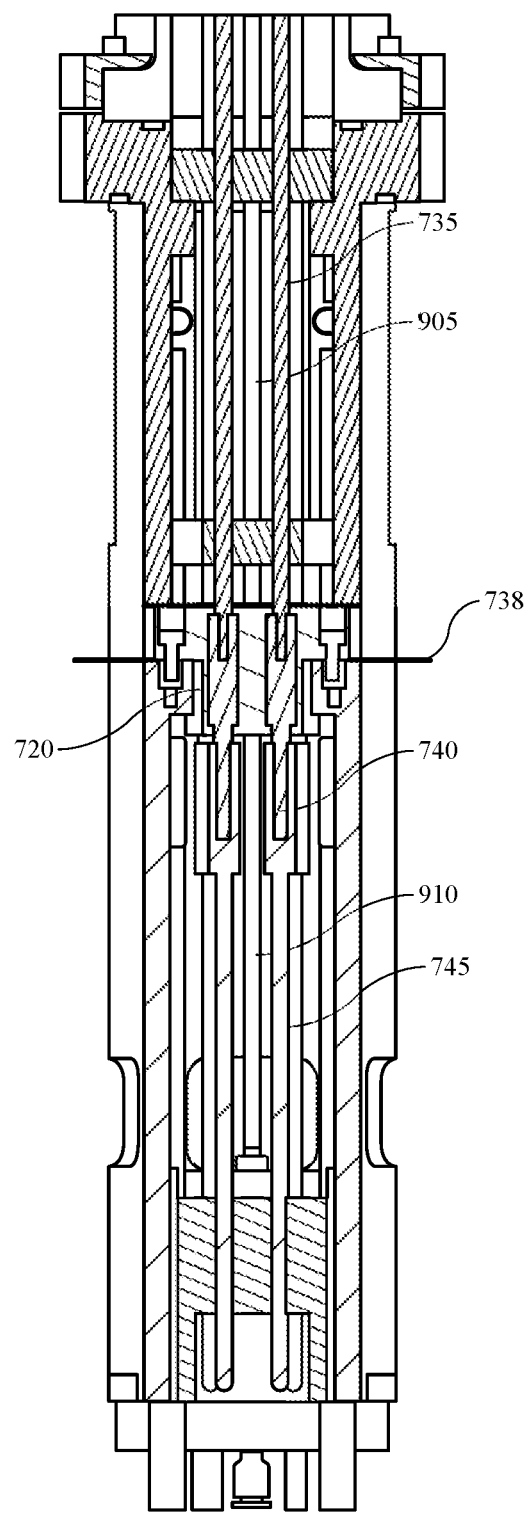
FIG. 9 shows a schematic cross-sectional partial view of an exemplary substrate support according to some embodiments of the present technology.

FIG. 9 shows a schematic cross-sectional partial view of an exemplary substrate support according to some embodiments of the present technology, and may show a second cross-sectional view of substrate support 700. For example, the section may illustrate aspects of the heater rod couplings through the stem sections, such as with a cross section through second rod holder 720, and which may illustrate connector 740. Connector 740 may be similar to connector 340 described above, and may couple heater rod 735 with heater extension rod 745. For example, connector 740 may be removably seated within second rod holder 720 at a first end of the connector, and heater rod 735 may be disposed within the connector as previously described. Again, in some embodiments the heater rod 735 may not be fully recessed within the connector to accommodate thermal expansion as discussed above. Similarly, in some embodiments a gap may be maintained between the second rod holder 720 and the heater extension rod 745, which may allow the heater rod components to move during thermal contraction as the heater rod 735 cools.

Also illustrated is a thermocouple 905, which may extend up through the substrate support stem components to contact the platen and provide temperature readings. Thermocouple 905 may similarly include a connector allowing the components to be separated with the substrate subassembly, and thus the thermocouple 905 may include a thermocouple extension 910 extending through the third stem section 715, and coupling through the break 738. Thermocouple 905 may extend to the platen to monitor a temperature during processing, and may extend through the first stem section and the second stem section. The thermocouple extension may extend to second rod holder 720, where the extension may be coupled with thermocouple 905.

Thermocouple 905 may include components configured to interact and provide a voltage signal proportional to a temperature of the platen. A voltage signal produced by the thermocouple may be only a few volts, and thus interference produced by the RF extension rods may prevent any discernible readings from the thermocouple. Consequently, many thermocouples include a grounded housing providing RF shielding from interference from other components. However, without adequate shielding at the coupling between the thermocouple 905 and the thermocouple extension 910, RF signals may interfere with the thermocouple signal being delivered. Accordingly, in some embodiments the present technology may provide a shielded connection between the thermocouple and extension at second rod holder 720.

Figure 10A:
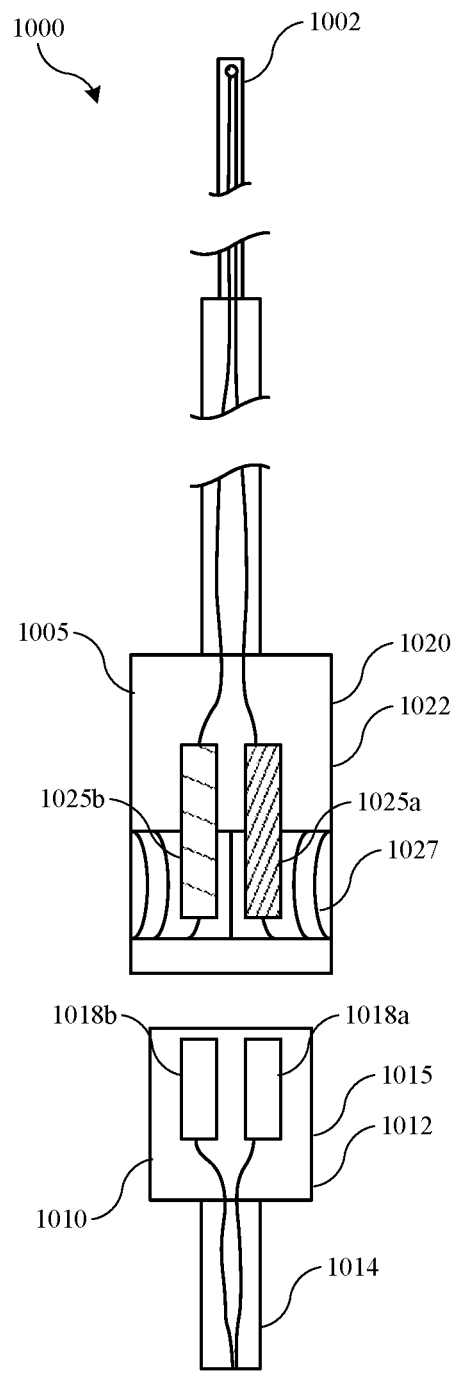
FIG. 10A shows a schematic cross-sectional partial view of an exemplary thermocouple assembly according to some embodiments of the present technology.

FIG. 10A shows a schematic cross-sectional partial view of an exemplary thermocouple assembly 1000 according to some embodiments of the present technology. The assembly may be a more detailed view of thermocouple 905 and thermocouple extension 910 described above. For example, thermocouple assembly 1000 may include a thermocouple 1005 and a thermocouple extension 1010. Thermocouple extension 1010 may be seated within second rod holder 720 similar to connector 740, and may extend through the rod holder. For example, thermocouple extension 1010 may include a first thermocouple connector 1012, that may seat in the rod holder, while thermocouple extension tail 1014 extends through an aperture through the rod holder. The first thermocouple connector 1012 may include a conductive housing 1015 extending about the connector. This may allow the first thermocouple connector 1012 to be electrically connected with electrical ground, providing a ground plane to facilitate shielding of the thermocouple assembly. Within the connector may be a set of sockets 1018, which may afford coupling with pins of the thermocouple.

For example, in exemplary thermocouples including two dissimilar metals or alloys, such as alumel and chromel, or any other materials that may be used to produce a thermocouple junction 1002 which may be placed in contact with the platen, first thermocouple connector 1012 may include a first socket 1018a and a second socket 1018b, which may be or may be coated with the individual metals to be paired with pins of the same material. The sockets may be disposed in ceramic or some other insulative material from housing 1015. The thermocouple extension 1010 may be seated within the rod holder to maintain a particular distance from any RF rods, such as centrally located as illustrated previously. Because the thermocouple extension may be grounded, maintaining the thermocouple extension and thermocouple a particular distance from the RF rods may ensure that shorting does not occur from the RF rods to the grounded housing. Accordingly, the thermocouple assembly components may be sized at dimensions to accommodate the substrate support assembly, and may be maintained within the rod holder at a distance of at least about 2 mm from any RF rod, and may be maintained a distance of greater than or about 3 mm from any RF rod, greater than or about 4 mm from any RF rod, greater than or about 5 mm from any RF rod, greater than or about 6 mm from any RF rod, greater than or about 7 mm from any RF rod, greater than or about 8 mm from any RF rod, or more. However, due to space constraints within the substrate support stem, the thermocouple extension and thermocouple may be located within a distance of 10 mm or less from any RF rod. This proximity may prevent use of RF gaskets for sealing the components, which may be characterized by annular thicknesses of at least about 10 mm or more, and which may not be suitable in some embodiments of the present technology where the components may be located within 10 mm or less from an RF rod or rods.

Thermocouple 1005 may include components configured to couple with thermocouple extension 1010, and which may produce a shielded enclosure for the junction wires through the assembly. For example, thermocouple 1005 may include a second thermocouple connector 1020, which may be configured to couple with first thermocouple connector 1012. Second thermocouple connector 1020 may also include a conductive housing 1022, which when engaged with first thermocouple connector 1012, may ground the second thermocouple connector. Second thermocouple connector 1020 may also include a set of connector pins 1025, which may engage with sockets 1018. For example, connector pin 1025*a* may be the same material as socket 1018*a*, with which it may engage, and connector pin 1025*b* may be the same material as socket 1018*b*, with which it may engage. Second thermocouple connector 1020 may also include a coupling 1027, such as a spring or other electrical coupling, which may provide an electrical connection with housing 1015 of first thermocouple connector 1012. Accordingly, second thermocouple connector 1020 may recess connector pins 1025 within an end of the housing as illustrated. The pins may be seated within ceramic or other materials.

Figure 10B:
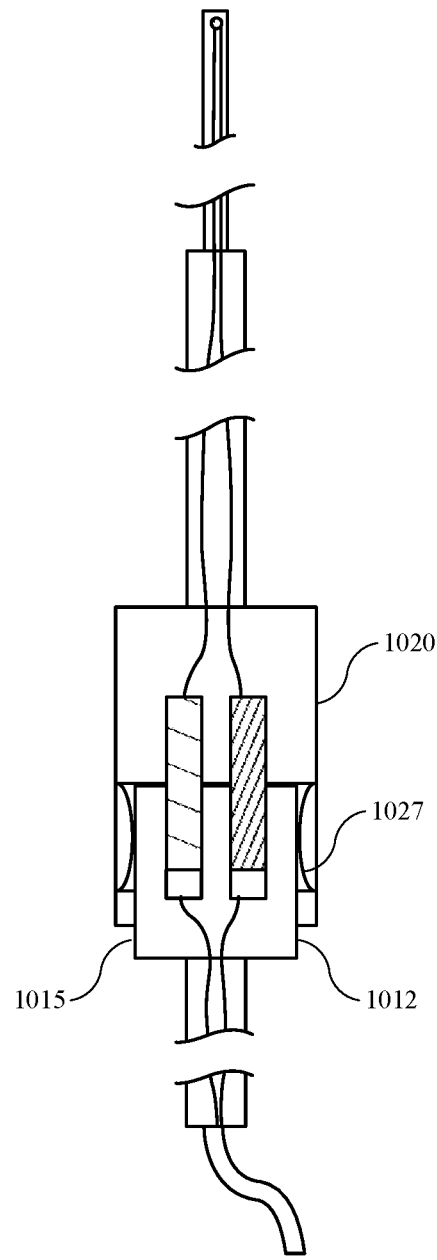
FIG. 10B shows a schematic cross-sectional partial view of an exemplary thermocouple assembly according to some embodiments of the present technology.

FIG. 10B shows a schematic cross-sectional partial view of an exemplary thermocouple assembly 1000 according to some embodiments of the present technology, and may illustrate the thermocouple assembly when the first thermocouple connector 1012 is engaged with the second thermocouple connector 1020. As illustrated, when the two connectors are engaged, coupling 1027 may create an electrical and physical engagement circumferentially about housing 1015 of first thermocouple connector 1012, which may ground the connectors and create a complete RF shield for the thermocouple wires. Connector pins 1025 may seat within sockets 1018 to create a complete electrical coupling allowing the signal from the thermocouple to be passed along the extension. This may produce a thermocouple that can be disconnected during removal of the subassembly of the substrate support, while providing a protective shielding about the connection location. By utilizing components according to aspects of the present technology, substrate supports having extended length may be incorporated within semiconductor processing chambers, while still providing serviceability for the supports.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a rod" includes a plurality of such rods, and reference to "the connector" includes reference to one or more connectors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
   a platen characterized by a first surface configured to support a semiconductor substrate;
   a first stem section coupled with a second surface of the platen opposite the first surface of the platen, wherein a bottom end of the first stem section comprises a flange portion;
   a second stem section coupled with the first stem section, the second stem section comprising:
   a housing, wherein an upper end of the housing comprises a collar,
   a rod holder disposed within the housing,
   a connector seated within the rod holder at a first end of the connector,
   a heater rod disposed within the first end of the connector,
   a heater extension rod coupled with the connector at a second end of the connector,
   an RF rod,
   an RF extension rod extending through the rod holder, and an RF strap coupling an end of the RF extension rod with an end of the RF rod; and a sealing band that fits about a lateral surface of the flange portion and extends over a top surface of the flange portion and that couples with the collar of the housing to clamp the top surface of the flange portion to the housing along a longitudinal axis of the first stem section and the second stem section;
   wherein the RF rod is spatially separated from the RF extension rod near the flange portion.

2. The substrate support assembly of claim 1, wherein the connector is removably seated within the rod holder, wherein the second end of the connector extends through the rod holder, and wherein a gap is maintained between the rod holder and the heater extension rod.

3. The substrate support assembly of claim 1, wherein the housing defines an aperture proximate a location where the second stem section couples with the first stem section.

4. The substrate support assembly of claim 3, wherein a guide extending from the first stem section is accessible through the aperture defined in the housing.

5. The substrate support assembly of claim 1, wherein the RF extension rod is fixedly coupled in the rod holder, and wherein the RF strap comprises a flexible coupling configured to accommodate thermal expansion of the RF rod.

\* \* \* \* \*